United States Patent [19]

Berger et al.

[11] 3,916,218

[45] Oct. 28, 1975

[54] INTEGRATED POWER SUPPLY FOR MERGED TRANSISTOR LOGIC CIRCUIT

[75] Inventors: Horst H. Berger, Sindelfingen; Siegfried K. Wiedmann, Stuttgart, both of Germany

[73] Assignee: International Business Machines Corporation, Armonk, N.Y.

[22] Filed: July 15, 1974

[21] Appl. No.: 488,344

[30] Foreign Application Priority Data

Nov. 10, 1973 Germany ............................ 2356301

[52] U.S. Cl. ................ 307/213; 307/215; 307/296; 307/303; 307/313; 357/44; 357/46

[51] Int. Cl.$^2$ ..................H03K 19/08; H03K 19/34; H01L 27/04

[58] Field of Search ........ 357/44, 46; 307/296, 213, 307/215, 303, 313

[56] References Cited

UNITED STATES PATENTS 3,736,477 5/1973 Berger et al. ......................... 357/44

3,823,353 7/1974 Berger et al. ......................... 357/44

FOREIGN PATENTS OR APPLICATIONS 2,175,752 10/1973 France

OTHER PUBLICATIONS

Hibberd, *Integrated Circuits,* McGraw–Hill, N.Y., 1969, (TI Electronics Series), pp. 79 and 82.

*Primary Examiner*—William D. Larkins
*Attorney, Agent, or Firm*—Wesley DeBruin

[57] ABSTRACT

The disclosure is directed to Merged Transistor Logic, or Integrated Injection Logic.

More specifically, an improved monolithically integrated binary logic circuit and power supply therefor is disclosed.

36 Claims, 5 Drawing Figures

INTEGRATED POWER SUPPLY FOR MERGED TRANSISTOR LOGIC CIRCUIT

BACKGROUND OF THE INVENTION AND PRIOR ART

For reasons of costs and reliability efforts are made in bipolar monolithic technology to reach a maximum number of circuit components on one single semiconductor chip. Another fixed aim in the layout of monolithic semiconductor circuits consists in simplifying the process steps, or still better, to reduce them. In order to provide a higher number of circuit components on one single semiconductor chip the latter's surface has generally to be increased. This means, however, that the number of chips that can be made out of a circular semiconductor wafer is at first reduced. The yield of serviceable semiconductor chips out of one semiconductor wafer is thereby rapidly reduced.

It is well known in connection with the monolithic design of bipolar circuits, to provide a separate isolation pit for each circuit element, and to combine several circuit components within one single isolation pit. Semiconductor zones of the same type and at the same potential are preferably provided there jointly. It is also known to integrate jointly NPN and PNP transistors in a four-layer structure. In such a known circuit, the PNP transistor integrated together with the NPN transistor acts as a saturation -preventing circuit element (Microelectronic-Circuits and Application, N. M. Carrol, MacGraw Hill 1965, p. 76, FIG. 4). This known circuit cannot be realized, either, without the above-described surface-consuming isolation diffusion. Also the use of isolation pits does not accomplish any process simplification, or even a reduction of the number of process steps.

U.S. Pat. No. 3,736,477 discloses an improved monolithic structure of the above known circuit with complementary transistors.

In U.S. Pat. No. 3,736,477 a monolithic semiconductor circuit comprised of a lateral PNP transistor and an inversely operated vertical NPN transistor is disclosed. The lateral transistor is formed by a pair of mutually spaced P-type regions diffused in an N-type semiconductor body. The collector region has diffused therein a region of N-type constituting the collector of the vertical transistor. The semiconductor body constitutes the base region of the lateral transistor and the emitter region of the vertical transistor.

The basic circuit structure disclosed in U.S. Pat. No. 3,736,477 may be employed for a great variety of combinatorial logic networks by logically combining several basic circuits. It is to be noted that owing to the absence of isolation diffusion zones, the individual basic circuits can be integrated one beside the other without separation. Further, by using diffused resistors, a considerable amount of space can be saved as compared with known logic circuit families. In addition, the manufacturing process is less complicated and corresponds to that followed in the manufacture of one single planar transistor. It should further to be noted that the amount of space required is determined by the lateral structure of the one transistor. Each diffusion zone requires a certain amount of area on the planar surface. Also, selective diffusion processes are required for two transistor zones. Finally, it should be noted that separate wiring has to be provided for the logic combination and for the current supply.

U.S. Pat. No. 3,823,353, entitled "Multi Layered Transistor Having Reach-Through Isolating Contacts" granted July 9, 1974 on application Ser. No. 337,510, filed Mar. 2, 1973, to Horst H. Berger and Siegfried K. Wiedemann discloses logic circuits for performing the INVERTER and NOR functions and monolithic integrated structures for realizing the circuits. Employment of the basic circuit structure disclosed in U.S. Pat. No. 3,823,353 also has the advantage of flexibility of use for a great variety of combinatorial logic network. The structure disclosed in U.S. Pat. No. 3,823,353 is characterized in that it comprises a first layer of an opposed second conductivity type which is applied to a substrate of a first conductivity type, a second layer of the first conductivity type which is applied to the first layer, and a third layer of the second conductivity type which is applied to the second layer, and that for contacting the individual layers each partial structure is surrounded by frame-shaped zones penetrating the layers arranged on top of them and whose conductivity type corresponds to that of the layer to be contacted. The frame-shaped zones are preferably simultaneously employed as isolation zones.

The basic circuit structures disclosed in U.S. Pat. Nos. 3,736,477 and 3,823,353 respectively have the same equivalent circuit diagram, i.e. they are identical in their logic function. If now several of these basic logic circuits are assembled into combinatorial networks, for example NOR circuits, the current supply is preferably provided via a constant current source which is connected to the emitters arranged in parallel of the respective second transistors of the basic circuits. Of course, the current source could be formed by a fixed voltage with corresponding serial resistor. In that case, however, higher tolerances for the current have to be considered, owing to variations of temperature and supply voltage. However, particularly the voltage variations, for instance with battery operation that is attractive in the present case owing to the low power dissipation obtainable, are quite considerable. By using a suitable control circuit the problem of the voltage tolerances can be solved; but no control circuit has been known or provided prior to the invention which could be integrated to an optimum extent with the basic logic circuits described.

SUMMARY OF THE INVENTION

An embodiment of the invention may be briefly described as follows: A monolithically integrated device including a binary logic circuit and a power supply for said logic circuit. The binary logic circuit comprising at least one basic circuit consisting essentially of two interconnected complementary transistors, where the base of the first inversely operated transistor is connected to the collector of second transistor, and where the emitter of the first transistor is connected to the base of the second transistor. The power supply of said device being connected to the emitter of the second transistor of said basic circuit. The power supply providing a current to said emitter of said second transistor of said basic circuit which in accordance with an input signal applied to the base of the first transistor of said basic circuit controls the current through the first transistor which serves as the output signal.

The power supply includes two additionally and also integrated basic circuits of the type recited above. The first transistor of the first additional basic circuit being normally operated and the collector being connected to the base of the second transistor. The emitters of the second transistors of each of the additional circuits and the emitters of the second transistors of each of the basic circuits forming the logic circuit are connected in common to a voltage source. The bases of the second transistors of the additional basic circuits and of the basic circuits forming the logic circuit are interconnected. The collector of the first transistor of the second additional basic circuit is connected to the base of the first transistor of the first additional circuit.

The invention relates to a monolithically integrated, binary logic circuit with at least one basic circuit consisting of two complementary transistors, where the base of the first inversely operated transistor is connected to the collector of the second transistor, where the emitter of the first transistor is connected to the base of the second transistor, and where a power supply provides to the emitter of the second transistor a current whereby an input signal applied to the base of the first transistor controls the current serving as the output signal. The output signal being the collector current of the first transistor.

It is the primary object of the present invention to provide a monolithically integrated, binary circuit using the described logic circuit, where a power supply is provided which in its monolithic design can be integrated to an optimum degree, without isolation pits, i.e. in the same semiconductor substrate as the logic circuit itself.

It is a primary object of the invention to provide a monolithically integrated binary logic circuit where a power supply for said logic circuit is provided in the same monolithic structure as the logic circuit and the use of isolation pits is obviated.

It is a further object of this invention to provide an improved NOR circuit and power supply fabricated by large scale integrated circuit techniques.

It is a further object of this invention to provide an improved monolithically fabricated device.

It is a further object of this invention to provide an improved NOR circuit.

In accordance with the invention, these objects may be achieved by a monolithically integrated, binary logic circuit having at least one basic circuit consisting essentially of two complementary transistors and where the base of the first inversely operated transistor is connected to the collector of the second transistor, and where the emitter of the first transistor is connected to the base of the second transistor, and where from a power supply connected to the emitter of the second transistor, a current is fed in, which, as a function of the input signal, is applied to the base of the first transistor to control the current serving as the output signal from the first transistor. The power supply contains two additionally and also integrated basic circuits. The first transistor of the first additional basic circuit being normally operated and the collector being connected to the base of the second transistor. The emitters of the second transistors of the additional basic circuits are connected together with the emitters of the second transistors of the basic circuit forming the logic circuit to a common voltage source. The bases of the second transistors of the additional basic circuits and of the basic circuits forming the logic circuit are interconnected. The collector of the first transistor of the second additional basic circuit is connected to the base of the first transistor of the first additional basic circuit. In this manner, a controlled power supply is obtained for the logic circuit, said power supply consisting essentially of the same basic structures obtainable in the same process steps used for providing the logic circuit itself. Through this structure of the same type the power supply also shows the above described advantages of the logic basic circuit itself.

Additional objects, features and advantages of logic circuits according to the invention will be apparent from the following detailed description and the accompanying drawings.

BRIEF DESCRIPTION OF THE DRAWING

The invention will be described in detail below with reference to the two embodiments represented in the drawings.

DESCRIPTION OF THE PREFERRED EMBODIMENTS

Figure 1:
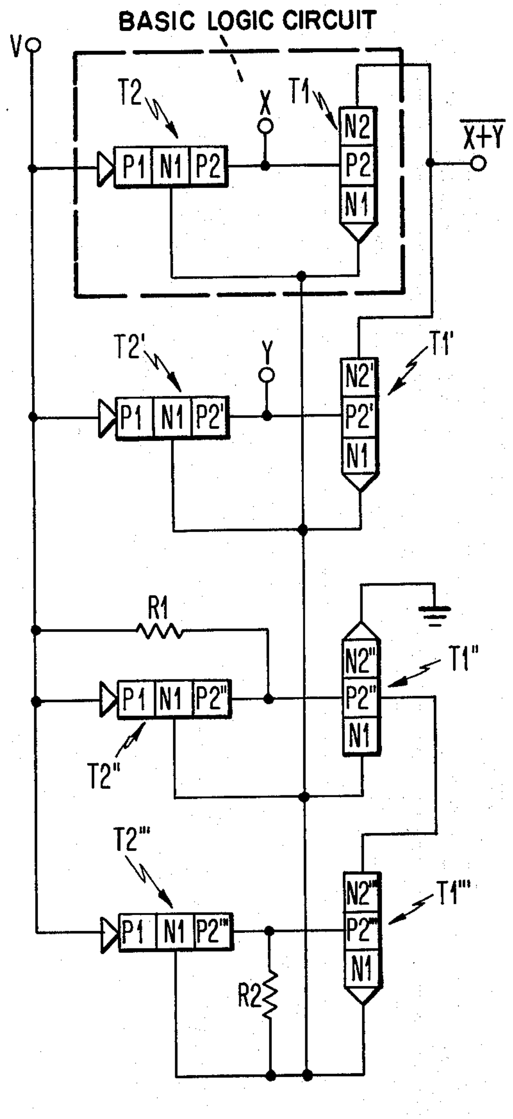
FIG. 1 discloses the circuit schematic of a NOR circuit and associated power supply for practicing the invention.

First, a review and description of the known basic logic circuit will be undertaken. From these basic logic circuits, in accordance with the invention the logic networks and associated power supplies are constructed. The electric equivalent diagram of the known basic logic circuit is shown in FIG. 1 enclosed within the broken line, bearing the legend "Basic Logic Circuit". The circuit includes two complementary transistors T1 and T2. Collector P2 of transistor T2 is connected to the base P2 of transistor T1. Base N1 of transistor T2 is connected to the emitter N1 of transistor T1. Via emitter P1 of transistor T2 a current is fed into the base P2 of transistor T1. Collector N2 of transistor T1 forms the output of the circuit. As shown in the equivalent diagram (FIG. 1), the two transistors T1, T2 show similar semiconductor zones which furthermore are at the same potential. These semiconductor zones have accordingly been given the same reference characters, and in the realization of the semiconductor structure they can be provided in common semiconductor zones.

The basic circuit operates as follows: If no defined potential is applied to the common collector base zone P2, the constant current fed into transistor T2 flows into the base of transistor T1. Transistor T1 is thus saturated. If, however, ground potential is applied to the common zone P2, i.e. to connection X, the constant current fed into transistor T2 flows off via this connection and cannot flow into the base of transistor T1. In that case, transistor T1 will be non-conductive. Taking into consideration the potentials appearing respectively at collector N2 of transistor T1, the combination of the two transistors T1 and T2 will on principle form an inverter. Such a basic logic circuit can universally be used for assembling a great variety of combinatorial logic networks.

The structure of a NOR circuit in accordance with the invention and employing the basic logic circuit will now be described. It is a known fact that all basic logics as well as complex logic combinatorial networks can be realized when only NOR circuits are used. In that respect, the NORing can be considered basic logic. As an example of a NOR logic circuit, FIG. 1 shows a NOR circuit comprised of two basic logic circuits with transistors T1, T2 and T1', T2'. Emitters P1 of the two transistors T2 and T2' are connected to a common voltage source V. Signals X and Y to be combined are applied to the collectors and bases P2 and P2', respectively, of the transistors of the basic logic circuits. The outputs of the collectors of the two first transistors T1 and T1' of the two basic logic circuits are interconnected, so that at the output the NORing function $\overline{X+Y}$ is obtained.

As described herein above, the known basic logic circuit advantageously permits the fabrication of a bipolar logic family. An essential advantage with respect to the structure, which will be described in connection with FIGS. 2A, 2B, 3A and 3B, consists in that all necessary components can be provided in a common substrate without the usual isolation pits. In the illustrated embodiments, the common zone is N1.

The circuit diagram of FIG. 1 shows how in accordance with the invention, by adding another two of the known basic logic circuits to the NOR circuit of the example, the power supply for this circuit can be optimally provided. These two additional basic circuits responsible for the power supply again each comprise two transistors, namely, T1'', T2'' and T1''', T2'''. These two basic circuits have substantially the same structure as the basic circuits forming the logic circuit. Emitters P1 of the two second transistors T2'' and T2''' are also connected to the common voltage source V. First transistor T1'', contrary to the corresponding transistors of the other basic circuits, is standard in operation, its emitter for instance is connected to ground potential. This, however, is not of importance structurally. For obtaining the necessary current control collector N2''' of first transistor T1''' of the second additional basic circuit is connected to base P2'' of the first transistor T1'' of the first additional basic circuit. Additionally, second transistor T2'' of the first additional basic circuit is bridged by a resistor R1. Additionally, between base P2''' and emitter N1 of first transistor T1''' of the second additional basic circuit a resistor R2 is provided.

The operation of the control circuit for the power supply of the NOR circuit of FIG. 1 is as follows: The circuit functions in the supply voltage range VBE (basis emitter voltage) $<$ V $<$ 2VBE, i.e. between 0.7 and 1.4 volts. Via resistor R1 the control is initiated, in that it supplies to first transistor T1'' of the first additional basic circuit an initial base current. Thus, this transistor withdraws collector current from common zone N1. As zone N1 forms in common, the base of all second transistors T2, T2', T2'', T2''', a base current flows simultaneously into each of these transistors. The effect of this base current is that the second transistors T2 and T2' of the NOR circuit, as well as the second transistors T2'' and T2''' of the additional basic circuits forming the control circuit, withdraw collector current. The collector current of second transistor T2'' of the first additional basic circuit increases the base current for first transistor T1'' of this basic circuit so that there is a feedback. This feedback maintains its effect until the collector current of second transistor T2''' of the second additional basic circuit generates at resistor R2 a voltage drop which in turn switches in first transistor T1''' of the second additional basic circuit. Since collector N2''' of first transistor T1''' of the second additional circuit is connected to the base of the normally operated first transistor T1'' of the first additional circuit, base current is withdrawn from transistor T1''. Thus, the control process is initiated by common zone N1 to the bases of all parallel-arranged second transistors T2, T2', T2'' and T2''', via collector N1 of T1'' and less total base current is drawn. The current produced by the power supply, via the parallel-arranged second transistors of the basic circuits, is given by their surface ratios and the ratio of the base to emitter voltage VBE of transistor T2''' to resistor R2. The temperature characteristics of the current obtained through this ratio is highly advantageous, in that as VBE decreases upon a temperature rise, the current of the parallel-arranged second transistors decreases since the logic level decreases accordingly. Thus, the speed of the logic circuit remains constant.

Two embodiments of the topological design and structure of a logic circuit with the circuit diagram of FIG. 1 will be described. The transistor zones in the equivalent diagram (FIG. 1) and in the monolithic structural embodiments (FIGS. 2A, 2B and 3A, 3B) bear identical reference characters to indicate the respective conductivity types. This provides a direct comparison and easy understanding of the correlation of the circuit diagram and structural embodiments.

Figure 2A:
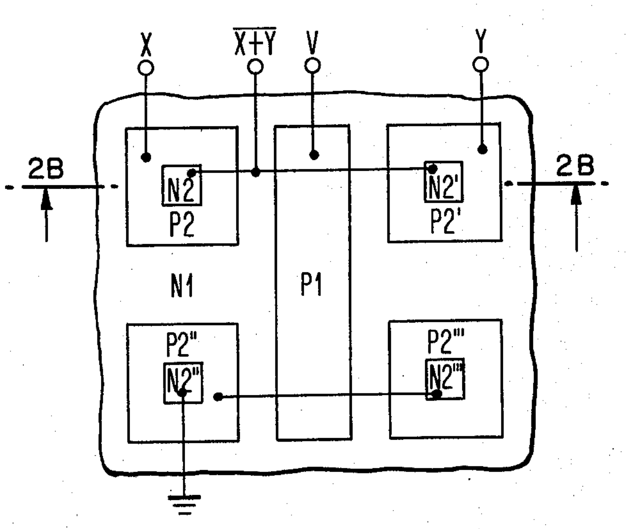
FIGS. 2A and 2B depict two views of a first structural monolithic embodiment of the invention having the circuit schematic of FIG. 1.
Figure 2B:
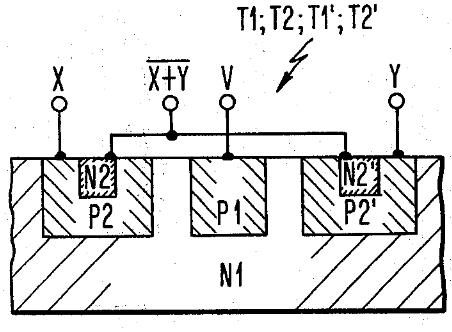

The plan view of FIG. 2A depicts the entire circuit of FIG. 1. Namely, the NOR circuit including the controlled power supply. The common semiconductor zone N1 (FIGS. 2A and 2B) forms the emitters of transistors T1, T1', T1''', the collector of transistor T1'' and the bases of transistors T2, T2', T2'' and T2'''. Semiconductor zone P1 is provided. This semiconductor zone (P1) forms the emitters of all second transistors of the four basic circuits shown. Namely, the emitters of transistors T2, T2', T2'' and T2'''. Arranged laterally to semiconductor zone P1, there are the four semiconductor zones P2, P2', P2'' and P2''' forming the collectors of the respective second transistors (T2, T2', T2'' and T2'''). Second transistors T2, T2', T2'' and T2''' of the four basic stages forming the NOR circuit and the control device comprise a lateral transistor structure. Into these four lateral transistor structures, the four first transistors of the basic circuits are incorporated in such a manner that they form vertical transistor structures. For that purpose, semiconductor zones N2, N2', N2'' and N2''' respectively form, the collector of transistor T1, the collector of transistor T1', the emitter of transistor T1'', and the collector of transistor T1'''. zones N2, n2', N2'' and N2''', as shown in FIGS. 2A and 2B, are respectively formed within zones P2, P2', P2'' and P2'''. FIG. 2B shows a sectional view comprising the two basic circuits of the NOR circuit. From FIGS. 2A and 2B it is seen that the power supply is integrated into the actual logic circuit structure. Also, it is apparent the power supply circuit structure requires entirely similar structure and does not require any additional process steps for its manufacture.

Figure 3A:
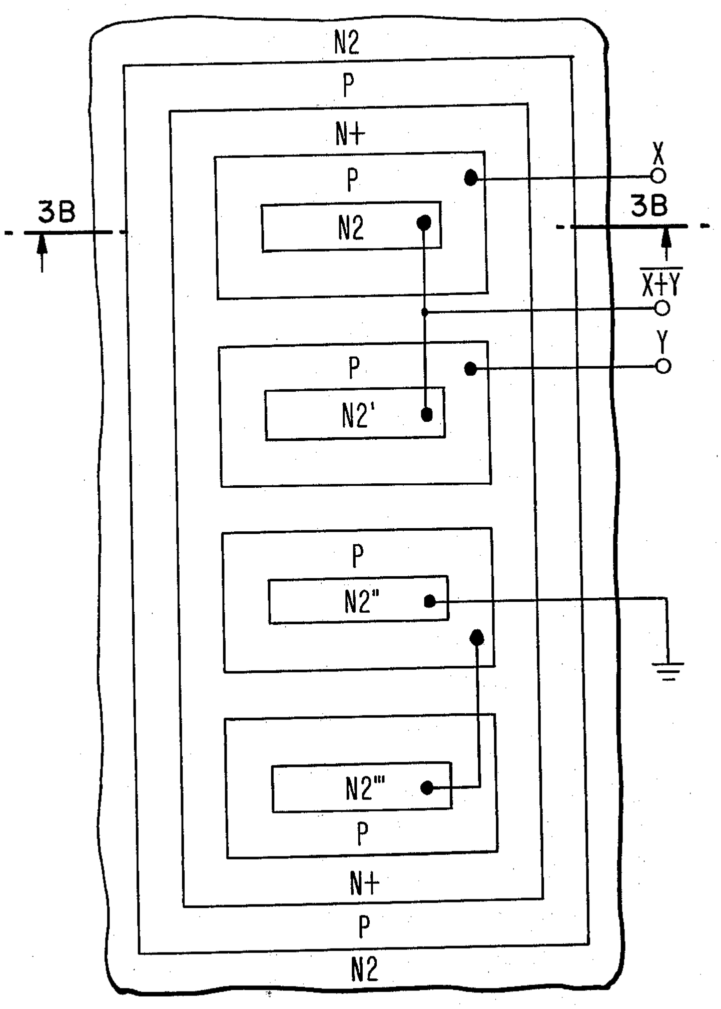
FIGS. 3A and 3B depict two views of a second structural monolithic embodiment of the invention having the circuit schematic of FIG. 1.
Figure 3B:
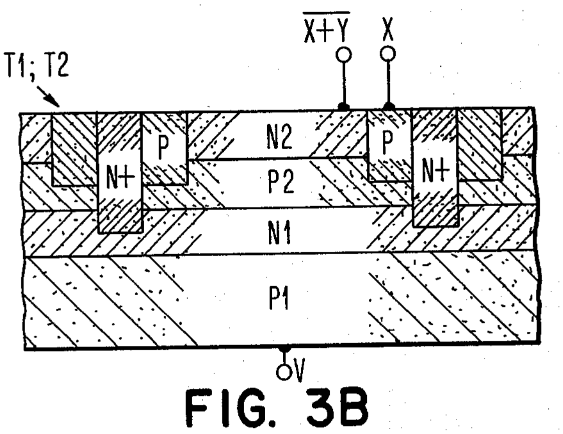

FIG. 3A, a second illustrative embodiment of the invention, shows the monolithic structure of the entire circuit of FIG. 1 in a plan view. It represents a layer structure where the individual basic circuits are formed by the incorporation of two respective vertical transistor structures. FIG. 3B shows the sectional view of one of the basic circuits with transistors T1 and T2. On a common semiconductor substrate, a plurality of such basic circuits are arranged, i.e. in the present example two basic circuits for the NOR circuit and two basic circuits as power supply. On semiconductor zone P1 serving as semiconductor substrate there is a first semiconductor zone N1, superimposed thereon a second semiconductor zone P2 and again superimposed thereon a semiconductor zone N2. The semiconductor zone P1 in turn serves as a common emitter of the respective second transistors T2, T2', T2'' and T2''' of the basic circuits. The superimposed semiconductor zone N1 forms: the bases for all second transistors T2, T2', T2'' and T2'''; the emitters of the first transistors T1, T1', and T1'''and the collector of first transistor T1''. The collectors of the second transistors are again identical with the bases of the first transistors and are formed by semiconductor zone P2. The final semiconductor layer N2 forms the collectors of first transistors T1, T1', and T1''', and the emitter of first transistor T1''. Each of these basic circuits is limited by frame-like zones P and $N^+$ (FIGS. 3A and 3B). Via zone P the contacting of semiconductor layer P2 is performed, whereas via zone $N^+$ common zone N1 is contacted. For that reason zone P has to extend at least into semiconductor layer P2, and zone $N^+$ at least into zone N1. Zone $N^+$ isolates the collectors and the bases of the individual basic circuits from each other.

The manufacturing process for such a structure is very simple. Owing to the uniform lamination over the entire semiconductor disc the making of the individual layers does not require a mask but can be performed by means of epitaxial growth onto substrate P1. Merely the making of zones P and $N^+$ requires masking.

Resistors R1 and R2 can be designed as external resistors, so that the resistance tolerances are kept low. On the other hand, however, the resistors can also be integrated in the semiconductor structure in a known manner as layer resistances.

Applicants' have described in detail preferred embodiments of their invention in addition to the detailed description of a general embodiment of their invention. From the disclosure and teaching of applicants' invention contained herein, numerous modifications to applicants' invention will be apparent to those skilled in the art, without departing from the spirit and the practice of the invention.

While the invention has been particularly described with reference to the preferred embodiment thereof, it will be understood by those skilled in the art that numerous changes in form and detail may be made without departing from the spirit and scope of the invention.

What is claimed is:

1. A monolithically integrated binary logic circuit for receiving first and second binary inputs respectively designated as $x$ and $y$ are providing a logical binary output of $\overline{x+y}$, said logic circuit comprising:

first, second, third and fourth transistors of a first conductivity type, said first, second, third and fourth transistors each having an emitter, base and collector;

fifth, sixth seventh and eighth transistors of a second conductivity type, said second conductivity type being opposite to said first conductivity type, and said fifth, sixth, seventh and eighth transistors each having an emitter, base and collector;

a first input terminal for receiving a first binary input designated as $x$ and directly connected to said collector of said first transistor and said base of said fifth transistor;

a second input terminal for receiving a second binary input designated as $y$ and directly connected to said collector of said second transistor and said base of said sixth transistor;

first means for applying a first potential on each of said emitters of said first, second, third and fourth transistors;

first connection means connecting in common said bases of said first, second, third and fourth transistors, said collector of said seventh transistor and said emitters of said fifth, sixth, and eighth transistors;

second connection means connecting said collector of said third transistor to said base of said seventh transistor;

third connection means connecting said collector of said fourth transistor to said base of said eighth transistor; fourth connection means connecting said base of said seventh transistor to said collector of said eighth transistor;

a first resistor connecting said collector of said third transistor to said emitter of said third transistor;

a second resistor connecting said base of said fourth transistor to said collector of said fourth transistor;

and an output terminal connected in common to said collector of said fifth transistor and said collector of said sixth transistor;

said output terminal providing the logical binary output of $\overline{x+y}$ in response to binary inputs of $x$ and $y$ respectively impressed on said first and second input terminals.

2. A monolithically integrated binary logic circuit as recited in claim 1 wherein said first, second and third connections means respectively consist of an integral portion of the semiconductor material of which said monolithically integrated binary logic circuit is fabricated.

3. A monolithically integrated binary logic circuit as recited in claim 2 wherein said first means consists of a terminal adapted to receive said first potential and an integral portion of the semiconductor material of which said monolithically integrated binary logic circuit is fabricated.

4. A monolithically integrated binary logic circuit as recited in claim 1 wherein said first and second resistors respectively consist of an integral portion of the semiconductor material of which said monolithically integrated logic circuit is fabricated.

5. A monolithically integrated binary logic circuit as recited in claim 1 wherein said first and second resistors are respectively discrete resistors.

6. A monolithically integrated binary logic circuit as recited in claim 1 wherein said first input terminal is connected to said collector of said first transistor and said base of said fifth transistor by an integral portion of the semiconductor material of which said monolithically integrated binary logic circuit is fabricated;

and said second input terminal is connected to said collector of said second transistor and said base of said sixth transistor by an integral portion of the semiconductor material of which said monolithically integrated binary logic circuit is fabricated.

7. A monolithically integrated binary logic circuit as recited in claim 1 wherein said first, second, third and fourth transistors are respectively laterally disposed within a monolithic semiconductor structure and said fifth, sixth, seventh and eighth transistors are respectively vertically disposed within said monolithic semiconductor structure.

8. A monolithically integrated binary logic circuit as recited in claim 7, wherein said bases of said first, second, third and fourth transistors;

said emitters of said fifth, sixth and eighth transistors and said collector of said seventh transistor are respectively formed in common by a first portion of said monolithic semiconductor structure of a first conductivity type.

9. A monolithically integrated binary logic circuit as recited in claim 8 wherein said emitters of said first, second, third and fourth transistors are respectively formed in common by a second portion of said monolithic semi-conductor structure of a second conductivity type.

10. A monolithically integrated binary circuit as recited in claim 1, wherein said first, second, third, and fourth transistors are respectively vertically disposed within a monolithic semiconductor structure and said fifth, sixth, seventh and eighth transistors are respectively vertically disposed above said first, second third and fourth transistors in said monolithic structure.

11. A monolithic integrated binary circuit as recited in claim 10 wherein said bases of said first, second, third and fourth transistors;

said emitters of said fifth, sixth and eighth transistors;

and said collector of said seventh transistor are respectively formed in common by a first portion of said monolithic semiconductor structure of a first conductivity type.

12. A monolithic integrated binary logic circuit as recited in claim 11 wherein said emitters of said first, second, third and fourth transistors are respectively formed in common by a second portion of said monolithic structure of a second conductivity type.

13. A monolithic integrated binary logic circuit as recited in claim 1 wherein said first, second, third and fourth transistors are respectively laterally disposed with respect to each of said fifth, sixth, seventh and eighth transistors:

and wherein said emitters of said first, second, third and fourth transistors are respectively formed in common by a first region of said first conductivity type;

said collector of said first transistor and said base of said fifth transistor are formed in common by a second region of said first conductivity type;

said collector of said second second transistor and said base of said sixth transistor are formed in common by a third region of said first conductivity type;

said collector of said third transistor and said base of said seventh transistor are formed in common by a fourth region of said first conductivity type, said collector of said fourth transistor and said base of said eighth transistor are formed in common by a fifth region of said first conductivity type, and said bases of said first, second, third and fourth transistors;

said collector of said seventh transistor;

and said emitter of said fifth, sixth and eighth transistors are formed in common by a sixth region of said second conductivity type.

14. A monolithic integrated binary logic circuit as recited in claim 1, wherein said first, second, third and fourth transistors are respectively vertically disposed within a monolithic chip of semiconductor material and;

said fifth, sixth, seventh and eighth transistors are respectively vertically disposed above said first, second, third and fourth transistors in said monolithic chip of semiconductor material.

15. A monolithic integrated binary logic circuit as recited in claim 14, wherein said emitters of said first, second, third and fourth transistors are respectively formed in common by a first region of said first conductivity type;

said collector of said first transistor and said base of said fifth transistor are formed in common by a second region of said first conductivity type;

said collector of said second transistor and said base of said sixth transistor are formed in common by a third region of said first conductivity type;

said collector of said third transistor and said base of said seventh transistor are formed in common by a fourth region of said first conductivity type;

said collector of said fourth transistor and said base of said eighth transistor are formed in common by a fifth region of said first conductivity type;

and said bases of said first, second, third and fourth transistors;

said collector of said seventh transistor;

and said emitters of said fifth, sixth and eighth transistors are formed in common by a sixth region of said second conductivity type.

16. An integrated NOR circuit on a monolithic chip of semiconductor material of a first conductivity type having at least one planar surface;

said monolithic chip of semiconductor material comprising:

a first elongated region of a second conductivity type lying on and extending into said planar surface, second, third, fourth and fifth regions of a second conductivity type lying on and extending into said planar surfaces;

said second, third, fourth and fifth regions being respectively positioned on said planar surface equidistant from said first elongated region;

a sixth region of said first conductivity lying on and extending into said planar surface;

said sixth region being encompassed by said second region;

a seventh region of said first conductivity lying on and extending into said planar surface;

said seventh region being encompassed by said third region;

an eighth region of said first conductivity lying on and extending into said planar surface;

said eighth region being encompassed by said fourth region;

a ninth region of said first conductivity lying on and extending into said planar surface;

said ninth region being encompassed by said fifth region;

first connection means for electrically connecting a first potential to said first elongated region;

second connection means for electrically connecting a second potential to said eighth region;

third connection means for electrically connecting said fourth region to said ninth region;

a first resistor connected between said fifth region and said monolithic chip of semiconductor material of said first conductivity type;

a second resistor connected between said fourth region and said first elongated region;

a first input terminal electrically connected to said second region;

a second input terminal electrically connected to said third region;

an output terminal electrically connected to said sixth and seventh regions;

whereby when logical binary inputs $x$ and $y$ are respectively electrically impressed on said first and second input terminals the logical binary function $\overline{x+y}$ will be electrically manifested at said output terminal.

17. A monolithically integrated binary logic circuit as recited in claim 15 wherein said first and second resistors respectively consist essentially of an integral portion of the semiconductor material of which said monolithically integrated circuit is fabricated.

18. A monolithically integrated binary logic circuit as recited in claim 15 wherein said first and second resistors are respectively discrete resistors.

19. An integrated NOR circuit on a monolithic chip of semiconductor material of a first conductivity type having at least one planar surface, said integrated NOR circuit comprising:

a buried region of a second conductivity type contained within said monolithic chip of semiconductor material;

said buried region of said second conductivity type lying beneath, spaced from, and extending substantially parallel to said planar surface of said monolithic chip of semiconductor material of said first conductivity type;

first, second, third and fourth discrete regions of said first conductivity type lying on and extending into said planar surface;

fifth, sixth, seventh and eighth discrete regions of said second conductivity type;

said fifth, sixth, seventh and eighth discrete regions lying on and extending into said planar surface;

said fifth, sixth, seventh and eighth discrete regions respectively lying within said first, second, third and fourth regions;

a ninth region of said second conductivity type lying on said planar surface and extending to said buried region of said second conductivity type;

said ninth region encompassing on the planar surface of said monolithic chip said first, second, third and fourth discrete regions of said first conductivity type;

a tenth region of said first conductivity type lying on and extending into said planar surface;

said tenth region encompassing on the planar surface of said monolithic chip said ninth region;

an eleventh region of said second conductivity type lying on and extending into said planar surface;

said eleventh region encompassing on the planar surface of said monolithic chip said tenth region;

first connection means for electrically connecting a first portion of said monolithic chip;

where said first portion is beneath said buried region, to a first potential;

second connection means for electrically connecting said seventh region to a second potential;

third connection means connecting said third region to said eighth region;

a first resistor electrically connected between said fourth region and said ninth region;

a second resistor electrically connected between said third region and said first portion of said monolithic chip;

a first input terminal electrically connected to said first region;

a second input terminal electrically connected to said second region;

an output terminal electrically connected to said fifth and sixth regions;

whereby when logical binary inputs $x$ and $y$ are respectively electrically impressed on said first and second input terminals the logical binary function $x+y$ will be electrically manifested at said output terminal.

20. A monolithically integrated binary logic circuit as recited in claim 19 wherein said first and second resistors respectively consist essentially of an integral portion of the semiconductor material of which said monolithically integrated circuit is fabricated.

21. A monolithically integrated binary logic circuit as recited in claim 19 wherein said first and second resistors are respectively discrete resistors.

22. A monolithically integrated binary logic circuit for receiving at least one input and providing a logical binary output, said logic circuit comprising:

first, second and third transistors of a first conductivity type;

said first, second and third transistors each having an emitter, base and collector;

fourth, fifth and sixth transistors of a second conductivity type, said second conductivity type being opposite to said first conductivity type, and said fourth, fifth and sixth transistors each having an emitter, base and collector;

an input terminal for receiving a binary input and directly connected to said collector of said first transistor and said base of said fourth transistor;

first means for applying a first potential on each of said emitters of said first, second and third transistors;

first connection means connecting in common said bases of said first, second and third transistors, said collector of said fifth transistor and said emitters of said fourth and sixth transistors;

second connection means connecting said collector of said second transistor to said base of said fifth transistor;

third connection means connecting said collector of said third transistor to said base of said sixth transistor;

fourth connection means connecting said base of said fifth transistor to said collector of said sixth transistor;

a first resistor connecting said collector of said second transistor to said emitter of said second transistor;

a second resistor connecting said base of said third transistor to said collector of said third transistor;

and an output terminal connected to said collector of said fourth transistor for providing the logical binary output.

23. A monolithically integrated binary logic circuit as recited in claim 22 wherein said first, second and third connection means respectively consist of an integral portion of the semiconductor material of which said monolithically integrated binary logic circuit is fabricated.

24. A monolithically integrated binary logic circuit as recited in claim 23 wherein said first means consists of a terminal adapted to receive said first potential and an integral portion of the semiconductor material of which said monolithically integrated binary logic circuit is fabricated.

25. A monolithically integrated binary logic circuit as recited in claim 22 wherein said first and second resistors respectively consist of an integral portion of the semiconductor material of which said monolithically integrated logic circuit is fabricated.

26. A monolithically integrated binary logic circuit as recited in claim 22 wherein said first and second resistors are respectively discrete resistors.

27. A monolithically integrated binary logic circuit as recited in claim 22 wherein said input terminal is connected to said collector of said first transistor and said base of said fourth transistor by an integral portion of the semiconductor material of which said monolithically integrated binary logic circuit is fabricated.

28. A monolithically integrated binary logic circuit as recited in claim 22 wherein said first, second and third transistors are respectively laterally disposed within a monolithic semiconductor structure and said fourth, fifth and sixth transistors are respectively vertically disposed within said monolithic semiconductor structure.

29. A monolithically integrated binary logic circuit as recited in claim 28, wherein said bases of said first, second and third transistors;

said emitters of said fourth and sixth transistors, and said collector of said fifth transistor are respectively formed in common by a first portion of said monolithic semiconductor structure of a first conductivity type.

30. A monolithically integrated binary logic circuit as recited in claim 29 wherein said emitters of said first, second and third transistors are respectively formed in common by a second portion of said monolithic semiconductor structure of a second conductivity type.

31. A monolithically integrated binary circuit as recited in claim 22, wherein said first, second and third transistors are respectively vertically disposed within a monolithic semiconductor structure, and said fourth, fifth and sixth transistors are respectively vertically disposed above said first second and third transistors in said monolithic structure.

32. a monolithic integrated binary circuit as recited in claim 31, wherein said bases of said first, second and third transistors;

said emitters of said fourth and sixth transistors;

and said collector of said fifth transistor are respectively formed in common by a first portion of said monolithic semiconductor structure of a first conductivity type.

33. A monolithic integrated binary logic circuit as recited in claim 32, wherein said emitters of said first, second and third transistors are respectively formed in common by a second portion of said monolithic structure of a second conductivity type.

34. A monolithic integrated binary logic circuit as recited in claim 22, wherein said first, second and third transistors are respectively laterally disposed with respect to each of said fourth, fifth and sixth transistors;

and wherein said emitters of said first, second and third transistors are respectively formed in common by a first region of said first conductivity type;

said collector of said first transistor and said base of said fourth transistor are formed in common by a second region of said first conductivity type;

said collector of said second transistor and said base of said fifth transistor are formed in common by a third region of said first conductivity type, said collector of said third transistor and said base of said sixth transistor are formed in common by a fourth region of said first conductivity type, and said bases of said first, second and third transistors, said collector of said fifth transistor, and said emitters of said fourth and sixth transistors are formed in common by a fifth region of said second conductivity type.

35. A monolithic integrated binary logic circuit as recited in claim 22, wherein said first, second and third transistors are respectively vertically disposed within a monolithic chip of semiconductor material and;

said fourth, fifth and sixth transistors are respectively vertically disposed above said first, second and third transistors in said monolithic chip of semiconductor material.

36. A monolithic integrated binary logic circuit as recited in claim 35, wherein said emitters of said first, second and third transistors are respectively formed in common by a first region of said first conductivity type;

said collector of said first transistor and said base of said fourth transistor are formed in common by a second region of said first conductivity type;

said collector of said second transistor and said base of said fifth transistor are formed in common by a third region of said first conductivity type;

said collector of said third transistor and said base of said sixth transistor are formed in common by a fourth region of said first conductivity type;

and said bases of said first, second and third transistors, said collector of said fifth transistor, and said emitters of said fourth and sixth transistors are formed in common by a fifth region of said second conductivity type.

* * * * *

UNITED STATES PATENT OFFICE
CERTIFICATE OF CORRECTION

PATENT NO. : 3,916,218

DATED : October 28, 1975

INVENTOR(S) : HORST H. BERGER et al

It is certified that error appears in the above-identified patent and that said Letters Patent are hereby corrected as shown below:

(Claim 19) column 12, line 29 "x + y" should read -- $\overline{x + y}$ --.

Signed and Sealed this twenty-seventh Day of April 1976

[SEAL]

Attest:

RUTH C. MASON
*Attesting Officer*

C. MARSHALL DANN
*Commissioner of Patents and Trademarks*